United States Patent
Li et al.

(10) Patent No.: US 8,963,266 B2
(45) Date of Patent: Feb. 24, 2015

(54) DEVICES INCLUDING BOND PAD HAVING PROTECTIVE SIDEWALL SEAL

(75) Inventors: Helen Hongwei Li, San Jose, CA (US); Joy Ellen Jones, Fremont, CA (US); Phillip J. Benzel, Pleasanton, CA (US); Jeanne M. McNamara, St. Cloud, FL (US); John T. Gasner, Satellite Beach, FL (US)

(73) Assignee: Intersil Americas LLC, Milpitas, CA (US)

( * ) Notice: Subject to any disclaimer, the term of this patent is extended or adjusted under 35 U.S.C. 154(b) by 336 days.

(21) Appl. No.: 13/491,195

(22) Filed: Jun. 7, 2012

(65) Prior Publication Data

US 2012/0241893 A1 Sep. 27, 2012

Related U.S. Application Data

(62) Division of application No. 12/957,095, filed on Nov. 30, 2010, now Pat. No. 8,536,044.

(60) Provisional application No. 61/362,577, filed on Jul. 8, 2010.

(51) Int. Cl.
*H01L 31/0232* (2014.01)
*H01L 27/146* (2006.01)
*H01L 23/00* (2006.01)

(52) U.S. Cl.
CPC .......... *H01L 27/14618* (2013.01); *H01L 24/05* (2013.01); *H01L 24/03* (2013.01); *H01L 2224/04042* (2013.01); *H01L 2224/03009* (2013.01)
USPC ............................. 257/432; 257/433; 257/431

(58) Field of Classification Search
CPC .................................................. H01L 31/0232
USPC ......................................... 257/433, 432, 431
See application file for complete search history.

(56) References Cited

U.S. PATENT DOCUMENTS

| | | | |
|---|---|---|---|
| 5,633,204 A | 5/1997 | Tago et al. | |
| 5,834,844 A | 11/1998 | Akagawa et al. | |
| 6,967,073 B2 | 11/2005 | Fasen et al. | |
| 7,960,269 B2 | 6/2011 | Lo et al. | |

(Continued)

OTHER PUBLICATIONS

Office Action dated Dec. 20, 2012, in U.S. Appl. No. 12/957,095, filed Nov. 30, 2010.
Office Action dated Apr. 25, 2013, in U.S. Appl. No. 12/957,095, filed Nov. 30, 2010.

(Continued)

*Primary Examiner* — Chuong A Luu
(74) *Attorney, Agent, or Firm* — Vierra Magen Marcus LLP

(57) ABSTRACT

A device having a detector includes a sensor package. The sensor package includes a light sensor, at least one filter located over the light sensor and at least one bond pad. The light sensor is formed on a semiconductor device that provides sensor information related to light incident upon the light sensor. A perimeter of each bond pad is covered by a protective layer forming a sidewall seal. The sensor package also includes a package that encases the light sensor, filter(s) and bond pad(s). Additionally, at least one package pin is communicatively coupled to the bond pad(s). The device also includes a functional circuit that is coupled to the sensor package and receives the sensor information from the light sensor. The device can be an ambient light sensor, camera, backlit mirror, handheld electronic device, filter device, light-to-digital output sensor, gain selection device, proximity sensor, or light-to-voltage non-linear converter.

20 Claims, 6 Drawing Sheets

(56) References Cited

U.S. PATENT DOCUMENTS

| | | | |
|---|---|---|---|
| 2003/0075752 A1* | 4/2003 | Motoyama | 257/306 |
| 2003/0102551 A1* | 6/2003 | Kikuchi | 257/701 |
| 2004/0147105 A1 | 7/2004 | Chang et al. | |
| 2004/0245580 A1* | 12/2004 | Lin | 257/379 |
| 2007/0015305 A1 | 1/2007 | Lin et al. | |
| 2010/0200898 A1* | 8/2010 | Lin et al. | 257/294 |
| 2010/0295064 A1* | 11/2010 | Loebl et al. | 257/84 |
| 2011/0068425 A1* | 3/2011 | Liao et al. | 257/432 |
| 2011/0095167 A1* | 4/2011 | Feng et al. | 250/207 |
| 2012/0007199 A1 | 1/2012 | Li et al. | |

OTHER PUBLICATIONS

Amendment dated May 29, 2013, in U.S. Appl. No. 12/957,095, filed Nov. 30, 2010.
Notice of Allowance dated Jun. 25, 2013, in U.S. Appl. No. 12/957,095, filed Nov. 30, 2010.
Office Action dated Jun. 13, 2012, in U.S. Appl. No. 12/957,095, filed Nov. 30, 2010.
Amendment dated Oct. 11, 2012, in U.S. Appl. No. 12/957,095, filed Nov. 30, 2010.
Amendment dated Feb. 8, 2013, in U.S. Appl. No. 12/957,095, filed Nov. 30, 2010.

* cited by examiner

DEVICES INCLUDING BOND PAD HAVING PROTECTIVE SIDEWALL SEAL

PRIORITY CLAIM

This application is a Divisional of U.S. patent application Ser. No. 12/957,095, filed Nov. 30, 2010 now U.S. Pat. No. 8,536,044, entitled PROTECTING BOND PAD FOR SUBSEQUENT PROCESSING, which claims priority to U.S. Provisional Patent Application No. 61/362,577, filed Jul. 8, 2010, entitled "PROTECTING BOND PAD FOR SUBSEQUENT PROCESSING". Priority is claimed to each of the above applications, each of which is hereby incorporated herein by reference.

DRAWINGS

Like reference numbers and designations in the various drawings indicate like elements.

DETAILED DESCRIPTION

Some embodiments described herein provide a process for manufacturing a bond pad that reduces imperfections on the bond pad. The bond pad process described herein can be implemented within other semiconductor fabrication processes that form an exposed bond pad. Such a process includes, for example, and not limited to, a color filter process, a coatable color filter process, or a dielectric stack process. The bond pad process provides a protective layer formed over a bond pad to reduce damage to the bond pad during subsequent processing of a device comprising the bond pad. Specifically, the bond pad process reduces contamination forming on the bond pad due to adding material to the device and reduces pitting of the bond pad after it is opened and exposed to the ambient environment.

Figure 1A:
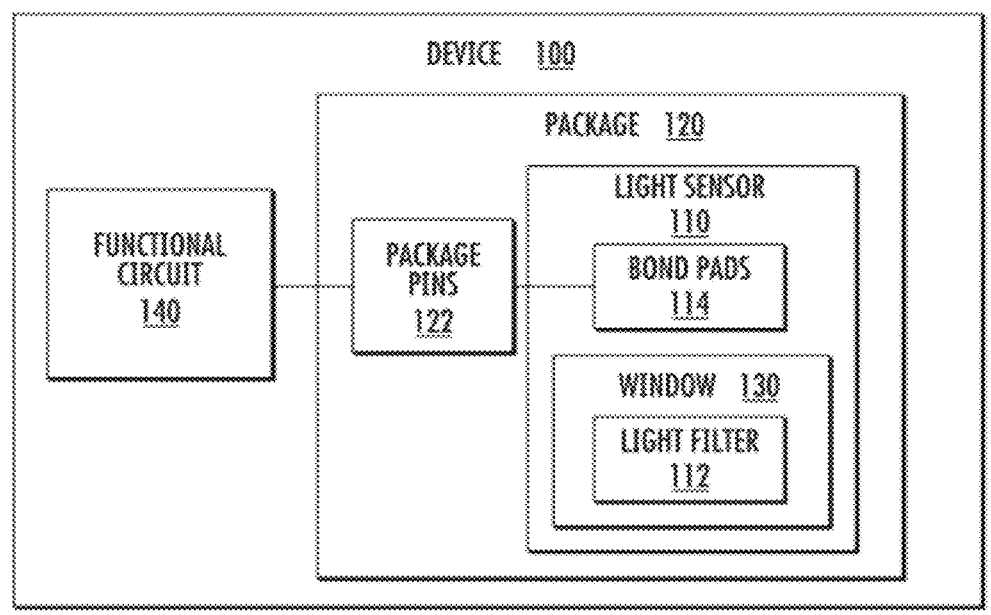
FIG. 1A is a block diagram of an embodiment of a device comprising a light sensor and a functional circuit.

FIG. 1A is an embodiment of a device 100 comprising a light sensor 110 and a functional circuit 140. The light sensor 110 is a semiconductor sensor that detects light of a specific frequency range. One embodiment of the light sensor 110 comprises at least a first light filter 112 and one or more bond pads 114. The one or more bond pads 114 are used to make an electrical connection between the light sensor 110 and an external circuit or device, such as functional circuit 140. Embodiments of the light sensor 110 are formed using a protective layer over each bond pad 114, as described in further detail below.

The light sensor 110 is assembled into a package 120 having a window 130. The package 120 encases and protects the light sensor 110 while providing an external electrical connection. In one embodiment, a bond pad 114 in the light sensor 110 is electrically connected to package pins 122 on the package 120. The window 130 exposes the light sensor 110 to incident light through the light filter 112. Embodiments of the window 130 are optically clear for at least a portion of the electromagnetic spectrum that the light sensor 110 operates over and is part of the package 120. In one embodiment, the package 120 is optically clear and does not include window 130.

The functional circuit 140 receives sensor information from the light sensor 110 and provides functionality for the device 100. Embodiments of the device 100 comprise any device that utilizes a light filter 112 or a light sensor 110, including but not limited to devices implementing ambient light sensors, cell phones, computers, applications using controlled backlighting, mirrors, cameras including RGB cameras with absorption based filters or dielectrically stacked filters, handheld electronic devices, dual filter devices, integrated light sensors, light-to-digital output sensors, gain selection devices, integrated digital ambient light sensors, proximity sensors, and ambient light-to-voltage non-linear converters.

Figure 1B:
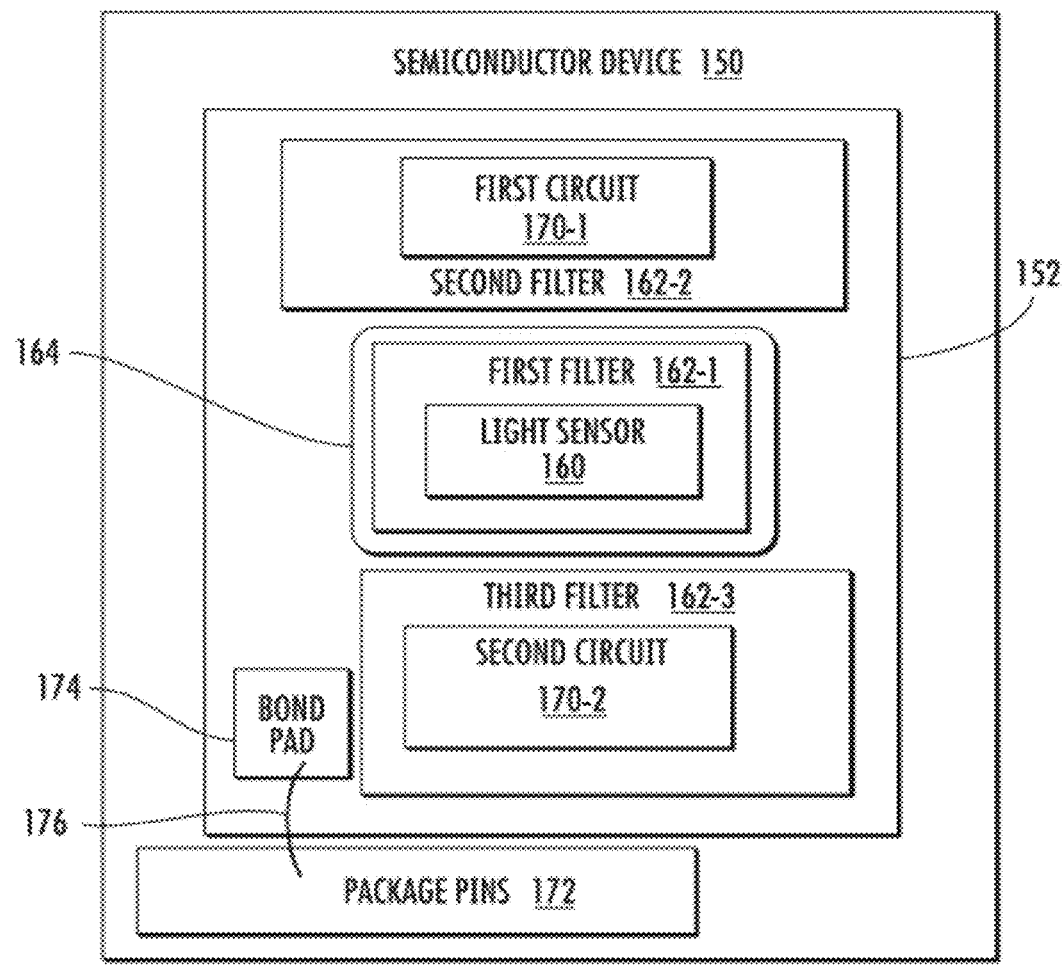
FIG. 1B is a block diagram of an embodiment of a semiconductor device comprising a light sensor on a wafer.

FIG. 1B is a block diagram of an embodiment of a semiconductor device 150 comprising a light sensor 160 on a wafer 152. Some embodiments of the semiconductor device 150 also act as a package. In other embodiments, the semiconductor device 150 is a micro-electro-mechanical systems (MEMS) device, or any other device that comprises a bond pad 174. The wafer 152 comprises any suitable substrate material known in the art, including but not limited to, silicon, sapphire, silicon on insulator (SOI), silicon on diamond (SOD), silicon carbide, gallium nitride (GaN), indium phosphide (InP), or the like. First and second circuits 170-1 and 170-2, at least one bond pad 174, at least a first window 164, and three filters 162-1, 162-2, and 162-3 are formed on the wafer 152.

The first and second circuits 170-1 and 170-2 at least provide functionality to utilize a signal output by the light sensor 160. The light sensor 160 outputs a signal or signals based on light received at the light sensor 160. The first filter 162-1 is located over the light sensor 160 and filters any light incident upon the light sensor 160. Second and third filters 162-2 and 162-3 filter light incident upon the first and second circuits 170-1 and 170-2, respectively, in embodiments where they are exposed to light. For example, such embodiments include where the window 164 extends over at least a portion of the first and second circuits 170-1 and 170-2 or where an opaque layer or package does not cover the first and second circuits 170-1 and 170-2.

The bond pad 174 is electrically connected to at least one of the light sensor 160 or the first and second circuits 170-1 and 170-2. A wire bond 176 electrically connects the bond pad 174 to at least one package pin 172. The wire bond 176 is bonded to the bond pad 174. Damage (for example, scratches), residue (for example, material from depositions), pitting (for example, holes, trenches, or gaps), and other impurities or imperfections of the bond pad 174 result in decreased performance of the electrical connection between the bond pad 174 and the wire bond 176, in turn causing reduced performance of the semiconductor device 150.

Figure 2A:
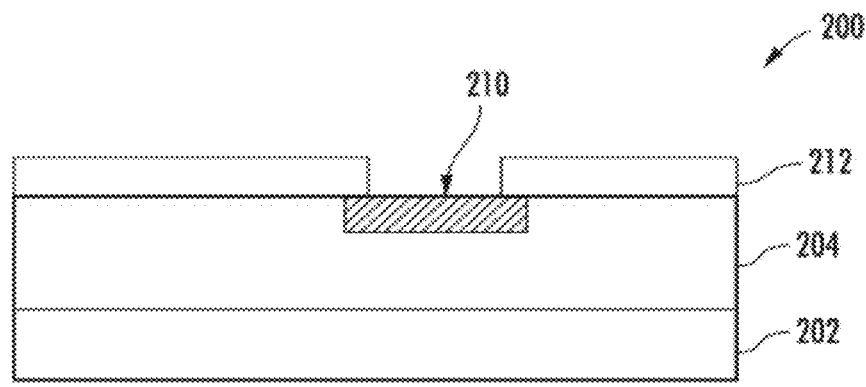
FIGS. 2A-2E are cross-sectional diagrams of one embodiment of a light sensor comprising at least one bond pad at different stages of fabrication.

FIGS. 2A-2E are cross-sectional diagrams of one embodiment of a semiconductor device 200, e.g., a light sensor, at different stages of fabrication. In FIG. 2A, the light sensor 200 comprises a substrate 202. Embodiments of the substrate 202 include any of the embodiments of the wafer 152 described above with respect to FIG. 1B. Formed over the substrate 202 is an intermediate region 204. The intermediate region 204 comprises circuitry for detecting light, for example, but not limited to, a photosensitive PN junction. Other embodiments comprise NPN, PNP, PIN, or NIP junctions. Some embodiments of the intermediate region 204 comprises a photosensitive layer including a photosensitive material and other components or layers known to those of skill in the art used in light sensor 200. Embodiments of the photosensitive material include a photoresist material, a photosensitive material such as polynorbornene, benzocylcobirtene, polyborazylene, polysilazane, polyarylene, polysiloxane, polybeozoxazole, a photosensitive fused ring polymer, or a dielectric stack of alternating layers and thicknesses. Implementations of the light sensor 200 are fabricated up to passivation (the first opening of a bond pad 210) using standard semiconductor fabrication processes, including but not limited to, a complementary metal-oxide-semiconductor (CMOS) process or a bipolar semiconductor process.

The light sensor 200 comprises at least one bond pad 210 that provides electrical connection between the light sensor 200 and an external circuit. The bond pad 210 comprises a conductive material including, but not limited to, aluminum (Al), aluminum-copper (AlCu), or the like. If the bond pad 210 is open during a color filter process, the surface of the bond pad 210 is exposed to the filter material and possibly to a chemical etch performed, for example, to strip a photoresist. Thus, precipitates may form on the bond pad 210, creating pitting. Furthermore, filter residue may be left on the bond pad 210 or cause damage to the surface of the bond pad 210. The process described herein reduces the occurrence of pitting, damage, and residue on the bond pad 210.

Figure 3A:
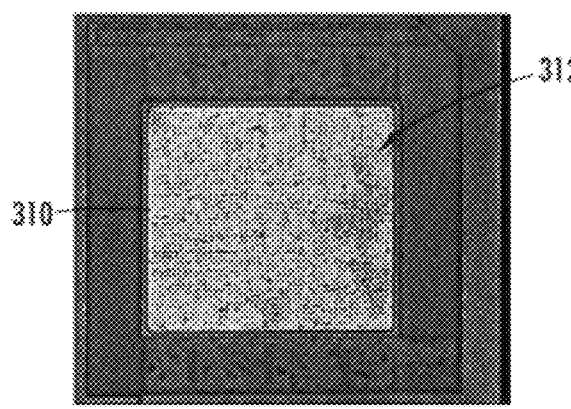
FIGS. 3A-3C are illustrations of imperfections in one embodiment of a bond pad.
Figure 3B:
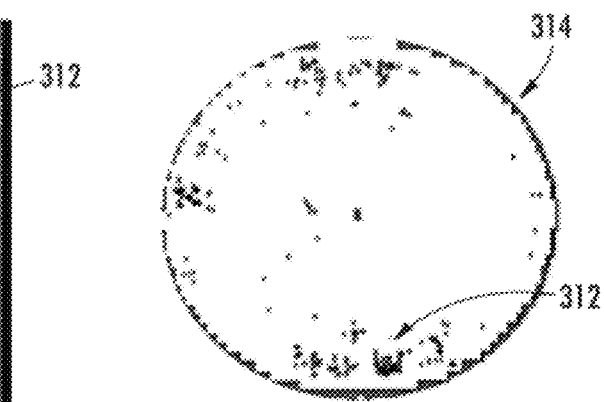
Figure 3C:
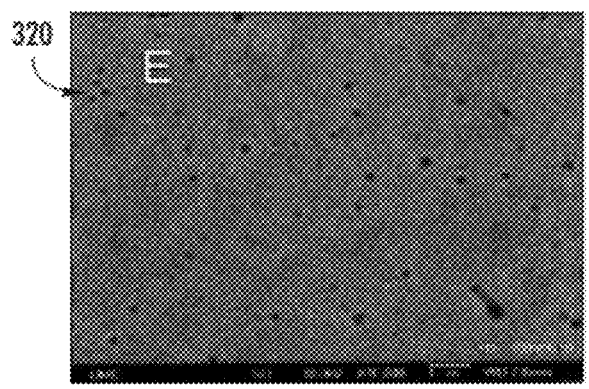

FIGS. 3A-3C are illustrations of imperfections in one embodiment of a bond pad 310. In FIG. 3A, residue 312 is shown on the bond pad 310. In one embodiment, the residue 312 is deposited on the bond pad 310 during a resist processing, such as color filter processing, performed after the bond pad 310 is exposed. Furthermore, insufficient development of the bond pad 310 adds to the occurrence and amount of residue 312. The surface of the bond pad 310 is exposed to chemicals used during the color filter process or dielectric filter process, for example. Thus, filter material remains on the bond pad 310 in the form of residue 312. FIG. 3B shows another view 314 of the residue 312.

FIG. 3C is an illustration of one embodiment of pitting 320 on the bond pad 310. Pitting results from electrochemical attack during the develop or clean process of the bond pad 310. Pitting is typically formed by a precipitate forming out of the bond pad 310. In an embodiment where the bond pad 310 comprises AlCu, copper (Cu) precipitates out of the bond pad 310 and forms pitting 320. Pitting 320 leads to or indicates corrosion, which reduces the reliability of the bond pad 310 to form a good bond with a wire bond. Damage can also result during processing performed while the bond pad 310 is exposed, such as removal of a dielectric filter (for example, through lift-off) in a dielectric filter process.

Returning to FIG. 2A, the light sensor 200 further comprises an oxide layer 212 that is formed over at least part of the bond pad 210 and the intermediate region 204. In some embodiments, the thickness of the oxide layer 212 is such that if the oxide layer 212 were etched after the formation of at least one color filter, the light sensor 200 would be damaged. Therefore, the oxide layer 212 is etched to expose the bond pad 210 before forming a color filter. This initial etching to expose the bond pad 210 is referred to as the first bond pad opening. In some embodiments, a diode for the light sensor 200 is formed before the first bond pad 210 opening.

Figure 2B:
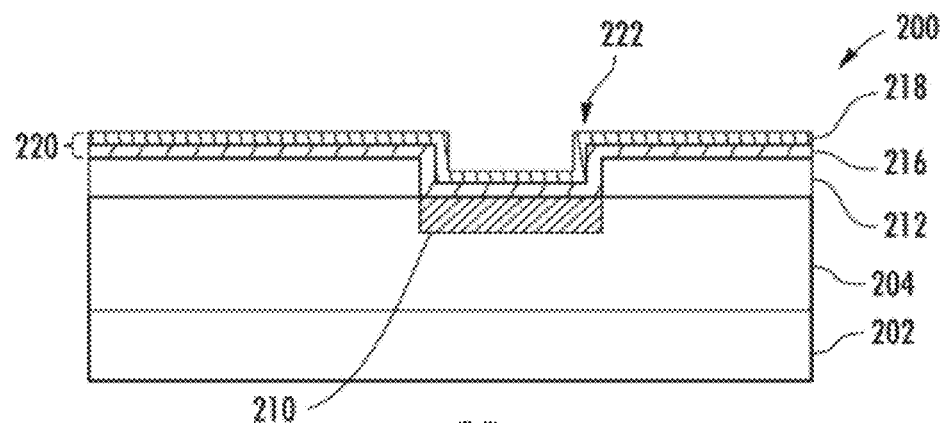

In FIG. 2B, a conformal protective layer 220 is formed over the bond pad 210 and the oxide layer 212. The protective layer 220 is a sacrificial layer that covers the bond pad 210 during subsequent processing steps of the light sensor 200 and is later removed. The protective layer 220 remains on the light sensor 200 during the filter process and is opened in a second subsequent pad opening step. In some embodiments, the protective layer 220 remains on part of the light sensor 200. In some embodiments where part of the protective layer 220 remains on the light sensor 200, the protective layer 220 is optically transparent. For example, one embodiment of the protective layer 220 is thin enough such that it is optically transparent for a range of wavelengths of light that the light sensor 200 is designed to detect. If the protective layer 220 is not optically transparent it is patterned to be open in the areas over the detectors. Some of the protective layer 220 forms on a sidewall region 222 of the oxide layer 212 within the gap surrounding the bond pad 210. The sidewall region 222 of the dielectric 212 is referred to herein as a passivation wall.

In the embodiment shown in FIG. 2B, the protective layer 220 comprises a first layer 216 and a second layer 218. In one embodiment, the first layer 216 comprises tetraethyl orthosilicate (TEOS) and the second layer 218 comprises silicon nitride ($Si_xN_y$). The TEOS layer 216 is deposited on the oxide layer 212 and the SiN layer 218 is deposited on the TEOS layer 216. In one embodiment, the TEOS layer 216 and the SiN layer 218 are up to approximately 300 Angstroms (Å) thick, but in other embodiments the layers 216 and 218 are thicker. In other embodiments, the protective layer 220 comprises a single layer or more than two layers. In another embodiment, the protective layer 220 comprises a thin oxide/nitride stack comprising a nitride layer formed over an oxide layer with a thickness up to approximately 300 Å. Implementations of the protective layer 220 include a single oxide layer, a titanium nitride (TiN) layer, silicon nitride, combinations thereof, or the like.

Figure 2C:
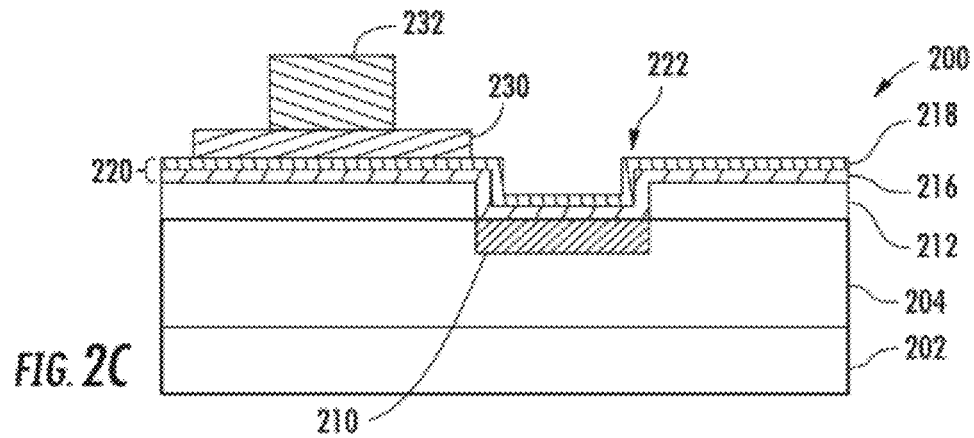

FIG. 2C shows a first filter 230 and a second filter 232 formed over the protective layer 220. The filters 230 and 232 filter light incident upon the light sensor 200. The protective layer 220 prevents residue due to the formation of the filters 230 and 232 from developing on the bond pad 210. In the embodiment shown in FIG. 2C, the second filter 232 is formed over the first filter 230. However, in other embodiments, the second filter 232 is located next to or on the same layer as the first filter 230. The first and second filters 230 and 232 are color or clear filters that filter light of a specific wavelength range. In the embodiment of FIG. 2C, the second filter 232 is a red filter formed over the first filter 230, which is green, thinner, and has a larger area than the second filter 232. However, other embodiments of the light sensor 200 implement other filter colors, shapes, and sizes. Furthermore, other embodiments include only the first filter 230 or more than two filters. Similarly, embodiments having dielectric reflective filters vary in that they have a single or multiple shapes, multiple filters side by side, or have stacked filters. In addition, some embodiments comprise both single and multiple filter stacks on different areas over the substrate 202.

In one embodiment, a stress relief layer is formed over the protective layer 220 at any time before the bond pad 210 is opened. The stress relief layer protects the light sensor 200 from some stresses and provides flexibility. Embodiments of the stress relief layer include, but are not limited to, polyimide or another polymer. Forming the stress relief layer when the bond pad 210 is already opened can result in damage to the bond pad 210. In one embodiment where a stress relief layer is used, a photoresist layer is not patterned to open the bond pad 210 until after the stress relief layer is formed.

Figure 2D:
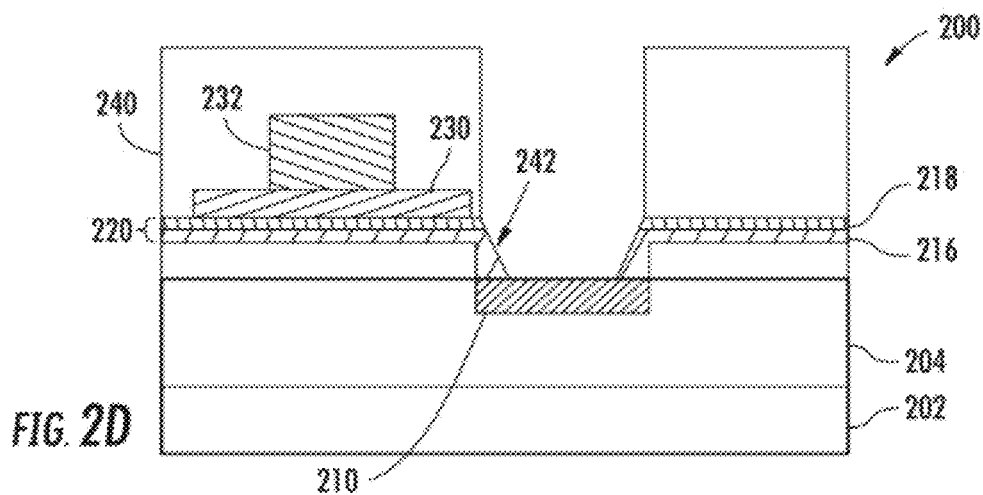

FIG. 2D illustrates a photoresist 240 formed over the filters 230 and 232 as well as the protective layer 220 that defines the bond pad 210. In some embodiments, the material of the photoresist 240 is removable by a process using chemistry that does not affect the filters 230 and 232. In embodiments where the filters 230 and 232 comprise a negative resist material, the photoresist 240 is a positive resist material. Similarly, when the filters 230 and 232 comprise a positive resist material, the photoresist 240 is a negative resist material. In contrast, embodiments including a dielectric stack employ either or both positive or negative resist materials.

In one embodiment, the photoresist 240 extends partially over the bond pad 210 such that it covers at least a portion of the protective layer 220 that is formed on the sidewall region 222. Extending the photoresist 240 over the sidewall region 222 defines an undersized bond pad opening. Thus, when an etch is performed to remove the protective layer 220, some of the protective layer 220 is left in the sidewall region 222 affixed to the oxide layer 212 on the passivation wall. This additional protective layer forms a sidewall seal 242, around at least part of a perimeter of the bond pad 210, provides moisture protection for the light sensor 200. A profile of such an embodiment shows a spacer made of protective layer 200 along the sidewall region 222. In one embodiment, the sidewall seal 242 is sloped at an angle less than approximately 90 degrees with respect to an upper surface of the bond pad 210. In embodiments where TiN is left over the bond pad 210, the profile resembles the profile of a light sensor 200 manufactured with a single bond pad opening method.

An etch is performed which removes the protective layer 220 located over the bond pad 210 for a second bond pad opening. This second bond pad opening is performed after the filters 230 and 232 are deposited, thus preventing residue forming on the bond pad 210 when the filters 230 and 232 are formed. During a sawing process, typically done at assembly, a liquid such as water is used to separate individual light sensors 200 from a group of light sensors made on a single wafer in a batch process. Any impurities in the liquid or molecules (such as silicon) given off when the wafer is cut can corrupt an exposed bond pad 210. In such embodiments, the protective layer 220 reduces the chance that the bond pad 210 is pitted during the sawing process. In one embodiment, the protective layer 220 remains on the bond pad 210 until after the sawing process. In such embodiments, the bond pad 210 is reopened after sawing is complete.

If the oxide layer 212 was not originally etched in the first bond pad opening, it is removed after the photoresist 240 is patterned. The standard bond pad opening process causes a hard crust to form on an upper surface of the photoresist 240. A plasma ash removes this hard surface; however, a plasma ash can damage the color filters located under the photoresist 240. Providing the protective layer 220 eliminates the need to perform a plasma ash to remove the hard surface because the crust is not formed. During the second bond pad opening, the resist 240 does not develop a hard surface because the protective layer 220 requires a shorter etch time to remove it than if the thicker oxide layer 212 was removed in a single etch. In one embodiment, a wet only etch is used to clear the bond pad 210 of photoresist 240 without damaging the filters 230 and 232.

In embodiments with a dielectric stack, a plasma ash is performed after the first bond pad opening. In other embodiments, the bond pad 210 is opened after color filters or a dielectric stack is formed. An embodiment having a single pad opening process tunes an etch in such a way as to avoid the need for a plasma ash. For example, one implementation employs a short plasma etch that opens a silicon nitride layer protective layer 220 and a wet etch to remove the oxide 212 over the bond pad 210. For embodiments using TiN, or a similar material such as TiW as part of or all of the protective layer 220, a wet dip is performed to remove the TiN, TiW, or similar material over the surface of the bond pad 210. A plasma etch can be performed to remove the resist without damaging filters 230 and 232 because the plasma ash will not affect the dielectric filters.

Figure 2E:
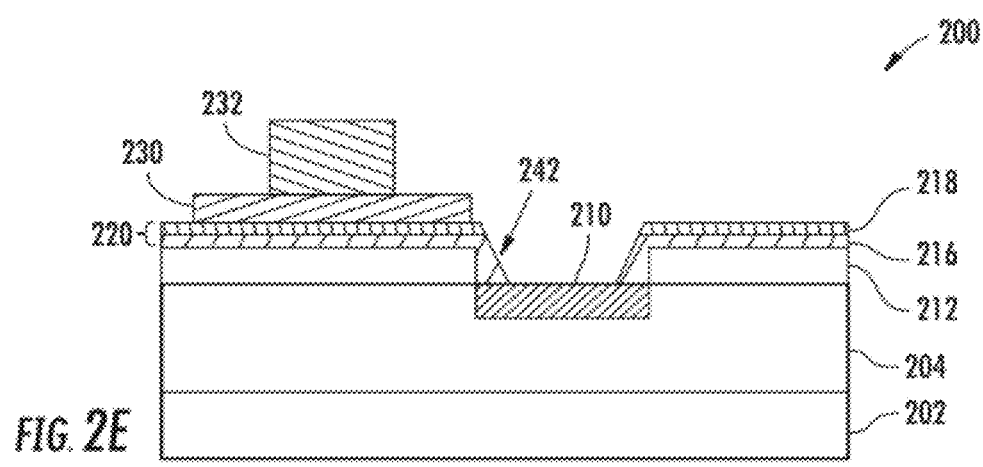

FIG. 2E shows the light sensor 200 after the photoresist 240 is removed. The layers above the exposed bond pad 210 (such as the sidewall seal 242) are more sloped when the light sensor 200 is formed using the two bond pad opening process than when a single bond pad opening is performed. The sloped edge of the sidewall seal 242 improves reflectivity from the bond pad 210.

In one embodiment, the at least one bond pad 210 is a stacked metal bond pad comprising a metal cap over an aluminum layer. The metal cap, such as TiN, is opened using either a wet dip or a short plasma etch.

Figure 4:
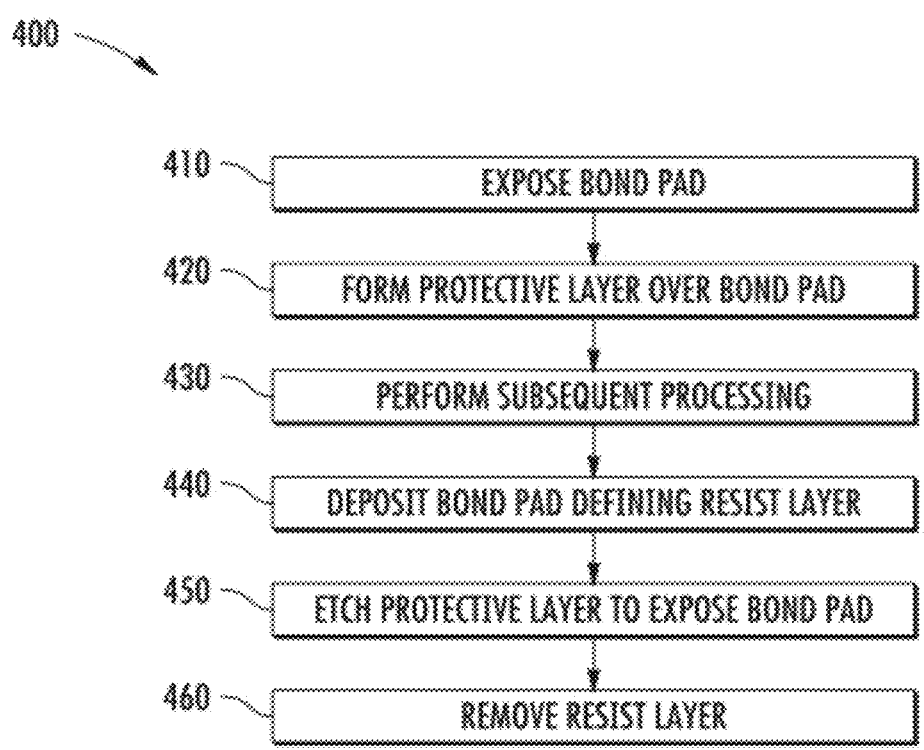
FIG. 4 is a flowchart of one embodiment of a method for a bond pad process.

FIG. 4 is a flowchart of one embodiment of a method 400 for a bond pad process for a semiconductor device, such as semiconductor device 150. Prior to this first bond pad opening, the semiconductor device 150 is fabricated using any suitable fabrication process. A passivation etch is performed on the semiconductor device to expose one or more bond pads, such as bond pads 174, from under a first layer (block 410). In one embodiment, the bond pad 174 is not completely exposed during the first bond pad opening. In this embodiment, a thin layer, such as oxide layer 212, remains over the bond pad 174 as the entirety or a portion thereof of a protective layer. That is, in some embodiments, some of the first layer remains after the passivation etch to protect the bond pad 174. Other embodiments include a titanium nitride (TiN) or titanium tungsten (TiW) cap on the bond pad 174 only, an oxide and TiN or TiW cap, or other protective layers.

Once the one or more bond pads 174 are exposed, a protective layer, such as protective layer 220 (for example, oxide, oxide with nitride, SiN, TiN, TiW, or the like), is formed over the one or more bond pads (block 420). In one embodiment, the protective layer 220 comprises one or more layers. In other embodiments, the protective layer covers none of, part of, or the entire first layer 212 in addition to covering the one or more bond pads 174.

Once the protective layer 220 covers the one or more bond pads 174, subsequent processing is performed to develop or produce any additional layers or components of the semiconductor device 150 (block 430). In embodiments where the semiconductor device 150 is a light sensor, any standard flow for filter technologies is followed, for example, at least a first filter is formed. After any additional steps are performed on the semiconductor device 150, a bond pad defining resist layer is patterned, such as positive resist layer 240 (block 440). The resist 240 covers the semiconductor device 150 except for over the one or more bond pads 174. An etch is performed to remove the protective layer 220 to expose the one or more bond pads 174 (block 450). Once the one or more bond pads 174 are exposed, the resist 240 is removed (block 460). In one embodiment, the resist 240 is stripped via solvent only.

By opening the one or more bond pads 174 in two steps, the majority of the thick passivation layer is removed, the bond pad 174 is protected during subsequent processing, and a standard pad opening processing can be utilized. The two step opening of the bond pad comprises opening a first portion of the bond pad and then opening a second portion of the bond pad. In some embodiments, the same portion of the bond pad is opened; that is, the first portion of the bond pad is the same as the second portion of the bond pad. In other embodiments, the first portion of the bond pad overlaps, is a subset of, or includes the entirety of the second portion of the bond pad.

In one embodiment, an oxide is created or deposited and a nitride cap is deposited to form a protective layer 220 after the initial passivation opening. The protective layer 220 reduces pad pitting, corrosion, damage, and residue on the bond pad 174, which increases the yield of a batch process. Embodiments described herein are integrated with any fabrication process for silicon wafers or any other semiconductor material. Embodiments described herein are suitable for wafer storage and have extended inventory life because the protective layer 220 can be etched at any time after the resist mask is patterned.

Another embodiment of a method for protecting a bond pad 174 that applies at least to a dielectric filter process includes first opening the bond pad 174 via a standard bond pad opening process. Then, a blanket deposit of a protective layer is formed over the wafer, such as TiN, TiW, polyimide, or combinations thereof. Then the protective layer is patterned with a resist such that it remains over the bond pad and at least a first circuit on the wafer. The exposed protective layer is then etched and a resist strip is performed to remove the resist. Next, any subsequent dielectric filter processes are performed, and once complete, the remaining protective layer is removed with a wet dip. One implementation of the wet dip uses $H_2O_2$ or a similar etchant.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are approximately preserved by the conformal material. The term "about" indicates that the value listed may be somewhat altered, as long as the alteration does not result in nonconformance of the process or structure to the illustrated embodiment.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

A computer or processor implementing the various embodiments described above can be implemented using software, firmware, hardware, or any appropriate combination thereof, as known to one of skill in the art. These may be supplemented by, or incorporated in, specially-designed application-specific integrated circuits (ASICs) or field programmable gate arrays (FPGAs). The computer or processor can also include or function with software programs, firmware, or other computer readable instructions for carrying out various process tasks, calculations, and control functions used in the present method and system.

Embodiments of the methods described above can be implemented by computer executable instructions, such as program modules or components, which are executed by a processor. Generally, program modules include routines, programs, objects, data components, data structures, algorithms, and the like, which perform particular tasks or implement particular abstract data types. In one embodiment, the processor controls machinery used in fabrication of semiconductor devices.

Instructions for carrying out the various process tasks, calculations, and generation of other data used in the operation of the methods and systems of the invention can be implemented in software, firmware, or other computer readable instructions. These instructions are typically stored on any appropriate computer program product that includes a computer readable medium used for storage of computer readable instructions or data structures. Such a computer readable medium can be any available media accessible by a general purpose or special purpose computer or processor, or any programmable logic device.

Suitable computer readable storage media may include, for example, non-volatile memory devices including semiconductor memory devices such as EPROM, EEPROM, or flash memory devices; magnetic disks such as internal hard disks or removable disks; magneto-optical disks; CDs, DVDs, or other optical storage disks; nonvolatile ROM, RAM, and other like media; or any other media that can be used to carry or store desired program code in the form of computer executable instructions or data structures.

A number of embodiments of the invention defined by the following claims have been described. Nevertheless, it will be understood that various modifications to the described embodiments may be made without departing from the spirit and scope of the claimed invention. Features and aspects of particular embodiments described herein can be combined with or replace features and aspects of other embodiments. Accordingly, other embodiments are within the scope of the following claims.

What is claimed is:

1. A semiconductor device, comprising:
a light sensor formed within the semiconductor device;
a passivation layer covering the light sensor;
a conformal sacrificial protective layer covering at least a portion of the passivation layer that covers the light sensor; and
a bond pad for the light sensor;
a bond pad opening that extends through the passivation layer and the conformal sacrificial protective layer and exposes a portion of a top surface of the band pad so that a wire bond can be bonded to the exposed portion of the top surface of the bond pad;
wherein the conformal sacrificial protective layer covers a perimeter of the bond pad without covering the exposed portion of the top surface of the bond pad and forms a sidewall seal for the bond pad; and
wherein the conformal sacrificial protective layer comprises at least one of an oxide, oxynitride, tetraethyl orthosilicate, silicon nitride, titanium nitride or titanium tungsten, or combinations thereof.

2. The semiconductor device of claim 1, wherein the conformal sacrificial protective layer comprises oxynitride.

3. The semiconductor device of claim 1, wherein the conformal sacrificial protective layer comprises tetraethyl orthosilicate.

4. The semiconductor device of claim 1, wherein the conformal sacrificial protective layer comprises titanium nitride.

5. The semiconductor device of claim 1, wherein the conformal sacrificial protective layer comprises titanium tungsten.

6. The semiconductor device of claim 1, wherein the conformal sacrificial protective layer comprises at least one of oxynitride, tetraethyl orthosilicate, titanium nitride or titanium tungsten, or combinations thereof.

7. The semiconductor device of claim 1, wherein the sidewall seal is sloped at an angle less than approximately 90 degrees with respect to an upper surface of the bond pad.

8. The semiconductor device of claim 1, further comprising a first filter located over the light sensor.

9. The semiconductor device of claim 8, further comprising:
a second filter located over the first filter, wherein the second filter has a smaller area of an upper surface than the first filter;
wherein the first and second filters are color filters.

10. The semiconductor device of claim 8, further comprising:
a stress relief layer between the conformal sacrificial protective layer and the first filter.

11. The semiconductor device of claim 1, wherein a package encloses the semiconductor device, the package including a window positioned over the light sensor.

12. The semiconductor device of claim 11, wherein the package comprises:
at least one package pin that is electrically coupled to the bond pad.

13. A device, comprising:
a sensor package, including:
a light sensor, formed within a semiconductor device, that provides sensor information related to light incident upon the light sensor;
a passivation layer covering the light sensor;
a conformal sacrificial protective layer covering at least a portion of the passivation layer that covers the light sensor; and
a bond pad for the light sensor;
a bond pad opening that extends through the passivation layer and the conformal sacrificial protective layer and exposes a portion of a top surface of the band pad so that a wire bond can be bonded to the exposed portion of the top surface of the bond pad;
at least one filter located over the light sensor; and
a package that encases the light sensor, the at least one filter, and the bond pad; and
at least one package pin communicatively coupled by a wire bond to the exposed portion of the top surface of the bond pad; and
a functional circuit that is coupled to the sensor package and receives the sensor information from the light sensor;
wherein the conformal sacrificial protective layer covers a perimeter of the bond pad without covering the exposed portion of the top surface of the bond pad and forms a sidewall seal for the bond pad; and
wherein the conformal sacrificial protective layer comprises at least one of an oxide, oxynitride, tetraethyl orthosilicate, silicon nitride, titanium nitride or titanium tungsten, or combinations thereof.

14. The device of claim 13, wherein the device is one of an ambient light sensor, a camera, a backlit mirror, a handheld electronic device, a filter device, a light-to-digital output sensor, a gain selection device, a proximity sensor, or a light-to-voltage non-linear converter.

15. The device of claim 13, wherein the conformal sacrificial protective layer comprises oxynitride.

16. The device of claim 13, wherein the conformal sacrificial protective layer comprises tetraethyl orthosilicate.

17. The device of claim 13, wherein the conformal sacrificial protective layer comprises titanium nitride.

18. The device of claim 13, wherein the conformal sacrificial protective layer comprises titanium tungsten.

19. The device of claim 13, wherein the conformal sacrificial protective layer comprises at least one of oxynitride, tetraethyl orthosilicate, titanium nitride or titanium tungsten, or combinations thereof.

20. The device of claim 13, wherein the sidewall seal is sloped at an angle less than approximately 90 degrees with respect to an upper surface of the bond pad.

* * * * *